United States Patent
Li et al.

(10) Patent No.: US 8,373,533 B2
(45) Date of Patent: Feb. 12, 2013

(54) POWER MODULE AND CIRCUIT BOARD ASSEMBLY THEREOF

(75) Inventors: Han Li, Shanghai (CN); Gang Liu, Shanghai (CN); Jing Chen, Shanghai (CN); Jinfa Zhang, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 383 days.

(21) Appl. No.: 12/851,237

(22) Filed: Aug. 5, 2010

(65) Prior Publication Data

US 2011/0032683 A1 Feb. 10, 2011

(30) Foreign Application Priority Data

Aug. 6, 2009 (TW) ................................ 98126685 A

(51) Int. Cl.
*H01F 27/29* (2006.01)
(52) U.S. Cl. ..................................................... 336/192
(58) Field of Classification Search .................. 336/192, 336/198, 200, 232; 361/760–766
See application file for complete search history.

(56) References Cited

U.S. PATENT DOCUMENTS

| 2007/0152795 A1* | 7/2007 | Zeng et al. | 336/212 |
| 2008/0180205 A1* | 7/2008 | Tsai et al. | 336/192 |
| 2008/0211613 A1* | 9/2008 | Lin et al. | 336/83 |

* cited by examiner

*Primary Examiner* — Tuyen Nguyen
(74) *Attorney, Agent, or Firm* — Kirton McConkie; Evan R. Witt

(57) ABSTRACT

A power module includes a first bobbin, a primary winding coil, a circuit board assembly and a first magnetic core assembly. The primary winding coil is wound around the first bobbin. The circuit board assembly includes a printed circuit board, a second winding structure, at least one current-sensing element, a rectifier circuit and an electrical connector. The second winding structure has an output terminal. The current-sensing element includes a first conductor. The first conductor is a conductive sheet. A first end of the first conductor is in contact with the output terminal of the second winding structure. A second end of the first conductor is connected to the rectifier circuit. The primary winding coil is aligned with the second winding structure of the circuit board assembly and arranged within the first magnetic core assembly. The primary winding coil and the electrical connector are electrically connected with a system board.

20 Claims, 4 Drawing Sheets

POWER MODULE AND CIRCUIT BOARD ASSEMBLY THEREOF

FIELD OF THE INVENTION

The present invention relates to a power module and a circuit board assembly thereof, and more particularly to a power module and a circuit board assembly thereof in order to reduce power loss.

BACKGROUND OF THE INVENTION

With increasing development of electronic industries, electrical devices are developed toward high integration level and high power density. As known, the high power-density design usually results in high frequency characteristics. Especially, the high frequency characteristics of magnetic elements are more critical.

FIG. 1 is a schematic perspective view illustrating the layout structure of a conventional power supply unit. As shown in FIG. 1, the conventional power supply unit 1 comprises a transformer 11, a rectifier 12 and a current transformer (CT) 13. The transformer 11, the rectifier 12 and the current transformer 13 are mounted on a system board 10. The primary winding coil of the transformer 11 receives an input voltage. The secondary winding coil of the transformer 11 is electrically connected to the system board 10 through a plurality of pins 111. The current transformer 13 comprises a conductive wire 131, which runs through the current transformer 13. The transformer 11 is electrically connected to the conductive wire 131 of the current transformer 13 through the pins 111 and the traces (not shown) of the system board 10. As such, the current outputted from the transformer 11 could be sensed by the current transformer 13. Similarly, the transformer 11 is electrically connected to the rectifier 12 through the pins 111 and the traces of the system board 10. The voltage outputted from the transformer 11 is regulated and rectified by the rectifier 12, and thus an output voltage is generated to a load (not shown).

Since the pins 111 of the transformer 11 need to be welded on the system board 10 and the transformer 11 is electrically connected to the rectifier 12 through the pins 111 and the traces of the system board 10, the distance between the secondary winding coil of the transformer 11 and the rectifier 12 is very long and the current path is also long. Under this circumstance, high power loss occurs at the welded sections and the current path. Furthermore, since the current transformer 13 of the conventional power supply unit 1 usually generates increased leakage inductance, additional power loss occurs. Under this circumstance, the reliability and the efficiency of the conventional power supply unit 1 are deteriorated. Since the transformer 11, the rectifier 12 and the current transformer 13 are electrically with each other after they are mounted on the system board 10, the process of assembling the conventional power supply unit 1 is complicated.

Therefore, there is a need of providing a power module and a circuit board assembly thereof so as to obviate the drawbacks encountered from the prior art.

SUMMARY OF THE INVENTION

An object of the present invention provides a power module and a circuit board assembly thereof in order to reduce the current path and the leakage inductance and increase the reliability and efficiency.

In accordance with an aspect of the present invention, there is provided a power module mounted on a system board. The power module includes a first bobbin, a primary winding coil, a circuit board assembly and a first magnetic core assembly. The primary winding coil is wound around the first bobbin. The circuit board assembly includes a printed circuit board, a second winding structure, at least one current-sensing element, a rectifier circuit and an electrical connector. The second winding structure, the current-sensing element, the rectifier circuit and the electrical connector are mounted on the printed circuit board. The second winding structure has an output terminal. The current-sensing element includes a first conductor. The first conductor is a conductive sheet. A first end of the first conductor is in contact with the output terminal of the second winding structure. A second end of the first conductor is connected to the rectifier circuit. The primary winding coil is aligned with the second winding structure of the circuit board assembly and arranged within the first magnetic core assembly. The primary winding coil and the electrical connector are electrically connected with the system board.

In accordance with another aspect of the present invention, there is provided a circuit board assembly of a power module. The power module is mounted on a system board. The power module includes a first bobbin and a first magnetic core assembly. The primary winding coil is wound around the first bobbin. The circuit board assembly includes a printed circuit board, a second winding structure, at least one current-sensing element, a rectifier circuit and an electrical connector. The second winding structure is disposed on the printed circuit board and includes an output terminal. The second winding structure is aligned with the primary winding coil, and arranged within the first magnetic core assembly. The current-sensing element is disposed on the printed circuit board and includes a first conductor. The first conductor is a conductive sheet and has a first end and a second end. A first end of the first conductor is in contact with the output terminal of the second winding structure. A second end of the first conductor is connected to the rectifier circuit. The circuit board assembly is electrically connected to the system board through the electrical connector.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
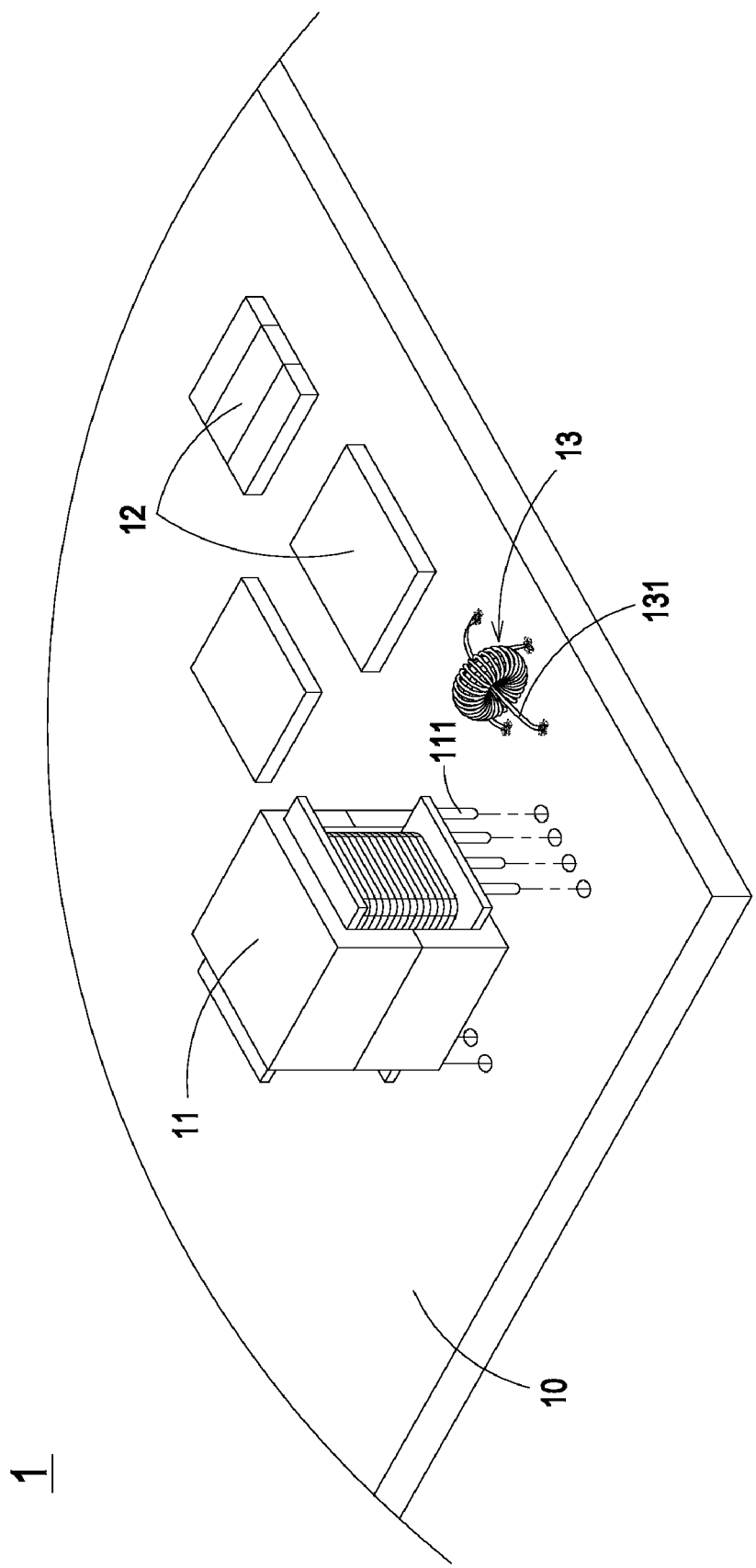
FIG. 1 is a schematic perspective view illustrating the layout structure of a conventional power supply unit.
Figure 2:
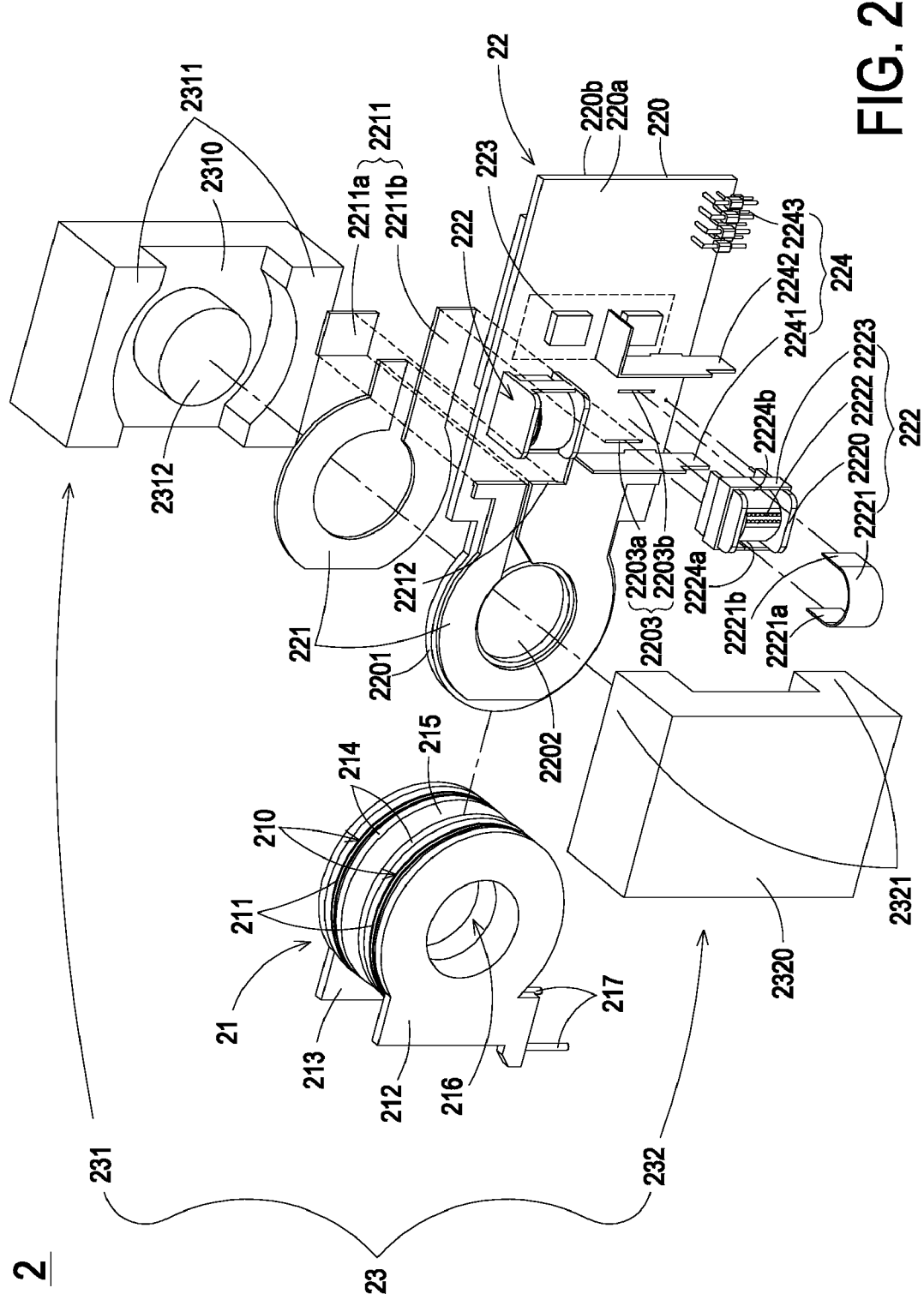
FIG. 2 is a schematic exploded view illustrating a power module according to an embodiment of the present invention.

FIG. 2 is a schematic exploded view illustrating a power module according to an embodiment of the present invention. As shown in FIG. 2, the power module 2 comprises a first bobbin 21, a circuit board assembly 22 and a magnetic core assembly 23. A primary winding coil 211 is wound around the first bobbin 21. The circuit board assembly 22 comprises a printed circuit board 220, a secondary winding structure 221, at least one current-sensing element 222, a rectifier circuit 223 and an electrical connector 224. The secondary winding structure 221, the current-sensing element 222, the rectifier circuit 223 and the electrical connector 224 are mounted on the printed circuit board 220. The secondary winding structure 221 has an output terminal 2211. The current-sensing element 222 comprises a first conductor 2221. A first end 2221a of the first conductor 2221 is in contact with the output terminal 2211 of the secondary winding structure 221. A second end 2221b of the first conductor 2221 is connected to the rectifier circuit 223. The primary winding coil 211 of the first bobbin 21 is aligned with the secondary winding structure 221 of the circuit board assembly 22, and arranged within the magnetic core assembly 23. The primary winding coil 211 and the electrical connector 224 are electrically connected with a system board 20 (see FIG. 3). As a consequence, the power module 2 is electrically and structurally connected to the system board 20. The detailed configurations of the power module 2 will be illustrated as follows.

Please refer to FIG. 2 again. The printed circuit board 220 of the circuit board assembly 22 is a single-layered or multi-layered printed circuit board. The printed circuit board 220 has a first surface 220a and a second surface 220b, which are opposed to each other. An extension part 2201 is laterally extended from an edge of the printed circuit board 220, and the secondary winding structure 221 is mounted on the extension part 2201 of the printed circuit board 220. The printed circuit board 220 comprises a perforation 2202. The perforation 2202 runs through the extension part 2201 in the direction perpendicular to the first surface 220a and a second surface 220b of the printed circuit board 220. In this embodiment, the perforation 2202 has a circular shape. The secondary winding structure 221 is a flat conductive plate made of for example copper foil. The perforation 2202 is sheathed by the secondary winding structure 221 and the secondary winding structure 221 is substantially parallel with the printed circuit board 220.

In this embodiment, the secondary winding structure 221 comprises two flat conductive plates that are respectively arranged on the first surface 220a and a second surface 220b of the printed circuit board 220. These two flat conductive plates are connected to a center-tapped head 2212. The secondary winding structure 221 comprises two output terminals 2211. The first output terminal 2211a and the second output terminal 2211b are disposed on the second surface 220b of the printed circuit board 220. For clarification, the secondary winding structure 221 is divided into two portions, which have unbroken ring-shaped configurations. The second portion of the secondary winding structure 221 is attached on the second surface 220b of the printed circuit board 220. Moreover, the secondary winding structure 221 has single-loop or multi-loop ring-shaped configurations. In some embodiments, the secondary winding structure 221 is directly printed on the printed circuit board 220.

Please refer to FIG. 2 again. At least one current-sensing element 222 is mounted on the printed circuit board 220 of the circuit board assembly 22. An example of the current-sensing element 222 includes but is not limited to a current transformer (CT). In this embodiment, two current-sensing elements 222 are mounted on the printed circuit board 220. Each of the current-sensing elements 222 comprises a second bobbin 2220, the first conductor 2221, a second conductor 2222 and a second magnetic core assembly 2223. The second conductor 2222 is for example a conductive coil wound around the second bobbin 2220 to be served as the secondary side of the current-sensing element 222. The second bobbin 2220 is enclosed by the second magnetic core assembly 2223. In addition, a first gap 2224a and a second gap 2224b exist between the second magnetic core assembly 2223 and the second bobbin 2220. In this embodiment, the first conductor 2221 is a U-shaped conductive sheet. The first end 2221a of the first conductor 2221 penetrates through the first gap 2224a. The second end 2221b of the first conductor 2221 penetrates through the second gap 2224b. As such, the second conductor 2222 is partially enclosed by the first conductor 2221. The second conductor 2222 is served as the secondary side of the current-sensing element 222. For minimizing the leakage inductance, the first conductor 2221 is a single-loop U-shaped conductive sheet. In addition, the first conductor 2221 and the second conductor 2222 are interposed within the second magnetic core assembly 2223.

The printed circuit board 220 further comprises several conductive holes. In this embodiment, the printed circuit board 220 comprises a first conductive hole 2203a and a second conductive hole 2203b. The first conductive hole 2203a is arranged at an edge of the second output terminal 2211b of the secondary winding structure 221, and electrically connected to the second output terminal 2211b of the secondary winding structure 221. The second conductive hole 2203b is electrically connected to the rectifier circuit 223 through the traces (not shown) of the printed circuit board 220.

The shortest distance between the first conductive hole 2203a and the second conductive hole 2203b is substantially equal to the shortest distance between the first gap 2224a and the second gap 2224b of the current-sensing element 222. In other words, the first conductive hole 2203a and the second conductive hole 2203b are aligned with the first gap 2224a and the second gap 2224b, respectively. The lengths of the first conductive hole 2203a and the second conductive hole 2203b are dependent on the lengths of the first end 2221a and the second end 2221b of the first conductor 2221, respectively. For mounting the current-sensing element 222 on the first surface 220a of the printed circuit board 220, the combination of the second bobbin 2220, the second conductor 2222 and the second magnetic core assembly 2223 is firstly placed on the first surface 220a of the printed circuit board 220, and then the first end 2221a and the second end 2221b of the first conductor 2221 are respectively inserted into the first conductive hole 2203a and the second conductive hole 2203b of the printed circuit board 220 through the first gap 2224a and the second gap 2224b. As such, the first end 2221a and the second end 2221b of the first conductor 2221 are slightly protruded outside the second surface 220b of the printed circuit board 220. In some embodiments, solder paste is applied on the jointing regions between the first end 2221a (and the second end 2221b) of the first conductor 2221 and the second surface 220b of the printed circuit board 220, thereby facilitating securely fixing the current-sensing element 222 on the printed circuit board 220. As such, the current-sensing element 222 is electrically and structurally connected to the printed circuit board 220.

Since the first conductive hole 2203a is electrically connected to the output terminal of the secondary winding structure 221 and the second conductive hole 2203b is electrically connected to the rectifier circuit 223 through the traces (not shown) of the printed circuit board 220, the first conductor 2221 of the current-sensing element 222 is electrically and structurally connected to the secondary winding structure 221 and the rectifier circuit 223 when the first end 2221a and the second end 2221b of the first conductor 2221 are respectively into the first conductive hole 2203a and the second conductive hole 2203b of the printed circuit board 220. The rectifier circuit 223 includes one or more rectifier switch elements (e.g. MOS switches). In this embodiment, the rectifier circuit 223 includes two rectifier switch elements.

Please refer to FIG. 2 again. The electrical connector 224 of the circuit board assembly 22 comprises an output pin 2241, a signal ground pin (SGND) 2242 and several signal pins 2243. The output pin 2241 is connected to the center-tapped head 2212 of the secondary winding structure 221. The signal ground pin 2242 is connected to the rectifier circuit 223. Via the signal pins 2243, signals could be transmitted between the power module 2 and the system board 20 (see FIG. 4). The output pin 2241, the signal ground pin 2242 and the signal pins 2243 are protruded from the periphery of the printed circuit board 220 and inserted into corresponding insertion holes of the system board 20 (see FIG. 3). After the secondary winding structure 221, the current-sensing element 222, the rectifier circuit 223 and the electrical connector 224 are mounted on the printed circuit board 220, the circuit board assembly 22 is produced.

Please refer to FIG. 2 again. The first bobbin 21 of the power module 2 comprises a first side plate 212 and a second side plate 213, which are disposed on bilateral sides of the first bobbin 21. In addition, at least one winding section 210 is arranged between the first side plate 212 and the second side plate 213. The primary winding coil 211 is a conductive coil that is wound around the winding section 210 of the first bobbin 21. In addition, several partition plates 214 are arranged between the first side plate 212 and the second side plate 213. The winding portions 210 are defined by the partition plates 214, the first side plate 212 and the second side plate 213. In this embodiment, the first bobbin 21 comprises two winding sections 210 and two partition plates 214. The number of the partition plates 214 could be varied as required. A receiving part 215 is defined by the two partition plates 214. The dimension of the receiving part 215 mates with the extension part 2201 of the printed circuit board 220 and the secondary winding structure 221. Furthermore, the first bobbin 21 comprises a channel 216 and a plurality of leads 217. The channel 216 runs through the first bobbin 21 in the direction perpendicular to the first side plate 212 and the second side plate 213. The channel 216 is in communication with the receiving part 215. The dimension of the channel 216 mates with the perforation 2202 of the printed circuit board 220. In this embodiment, the perforation 2202 of the printed circuit board 220 and the channel 216 of the first bobbin 21 are circular. The diameter of the channel 216 is substantially equally to the diameter of the perforation 2202. The leads 217 are extended from the peripheries of the first side plate 212 and the second side plate 213. The distal ends of the primary winding coil 211 is wound around the leads 217, so that the primary winding coil 211 is electrically connected to the system board 20 through the leads 217.

Please refer to FIG. 2 again. The first magnetic core assembly 23 of the power module 2 comprises a first magnetic part 231 and a second magnetic part 232. The first magnetic part 231 is substantially an E-shaped core, and the first magnetic core assembly 23 is an EE-type magnetic core assembly. The first magnetic part 231 has a flat slab 2310, two leg portions 2311 and a middle post 2312. These two leg portions 2311 are vertically protruded from bilateral edges of the flat slab 2310. The middle post 2312 is vertically protruded from a middle position of the flat slab 2310 and arranged between the two leg portions 2311. In this embodiment, the middle post 2312 is a short cylindrical post. The diameter of the middle post 2312 mates with the diameter of the channel 216 and the diameter of the perforation 2202. As such, the middle post 2312 is embedded into the channel 216 of the first bobbin 21 and the perforation 2202 of the printed circuit board 220. The flat slab 2320, the leg portions 2321 and the middle post of the second magnetic part 232 are identical to those of the first magnetic part 231, and are not redundantly described herein.

When the first bobbin 21, the circuit board assembly 22 and the first magnetic core assembly 23 are assembled into the power module 2, the extension part 2201 of the printed circuit board 220 and the secondary winding structure 221 mounted on the extension part 2201 will be accommodated within the receiving part 215 of the first bobbin 21. The secondary winding structure 221 and the primary winding coil 211 are aligned with each other. In addition, the primary winding coil 211 and the secondary winding structure 221 are isolated from each other by the partition plates 214. The perforation 2202 of the printed circuit board 220 is aligned with the channel 216 of the first bobbin 21. The middle posts of the first magnetic part 231 and the second magnetic part 232 are embedded into the channel 216 of the first bobbin 21 and the perforation 2202 of the printed circuit board 220. The flat slab 2310 and the leg portions 2311 of the first magnetic part 231 and the flat slab 2320 and the leg portions 2321 of second magnetic part 232 collectively define a contiguous structure, thereby enclosing the first bobbin 21, the extension part 2201 of the printed circuit board 220 and the secondary winding structure 221 between the first magnetic core assembly 23. As a consequence, the power module 2 is assembled. An example of the power module 2 includes but is not limited to a power supply module.

Figure 3:
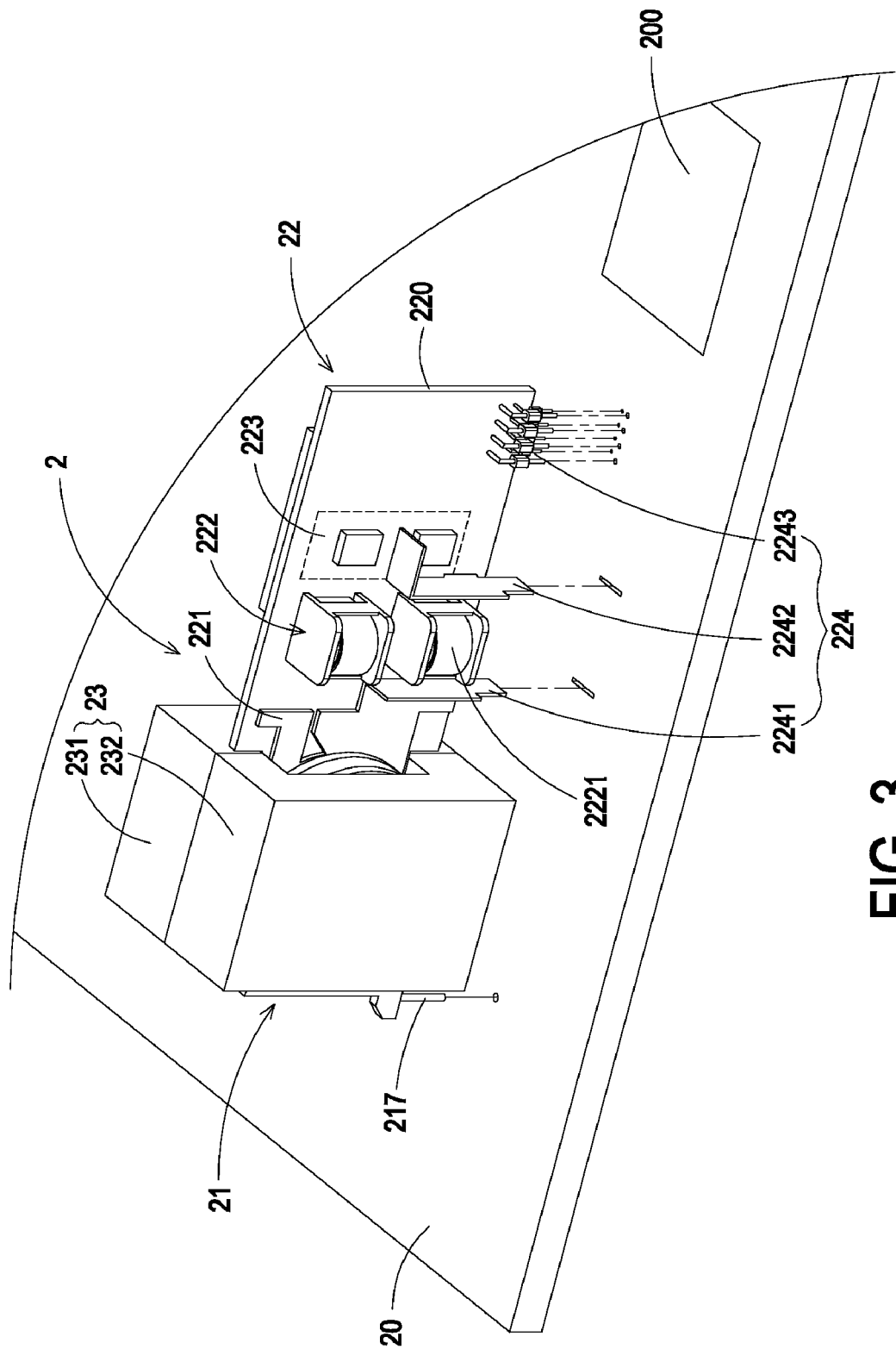
FIG. 3 is a schematic assembled view illustrating the power module of FIG. 2 mounted on a system board.
Figure 4:
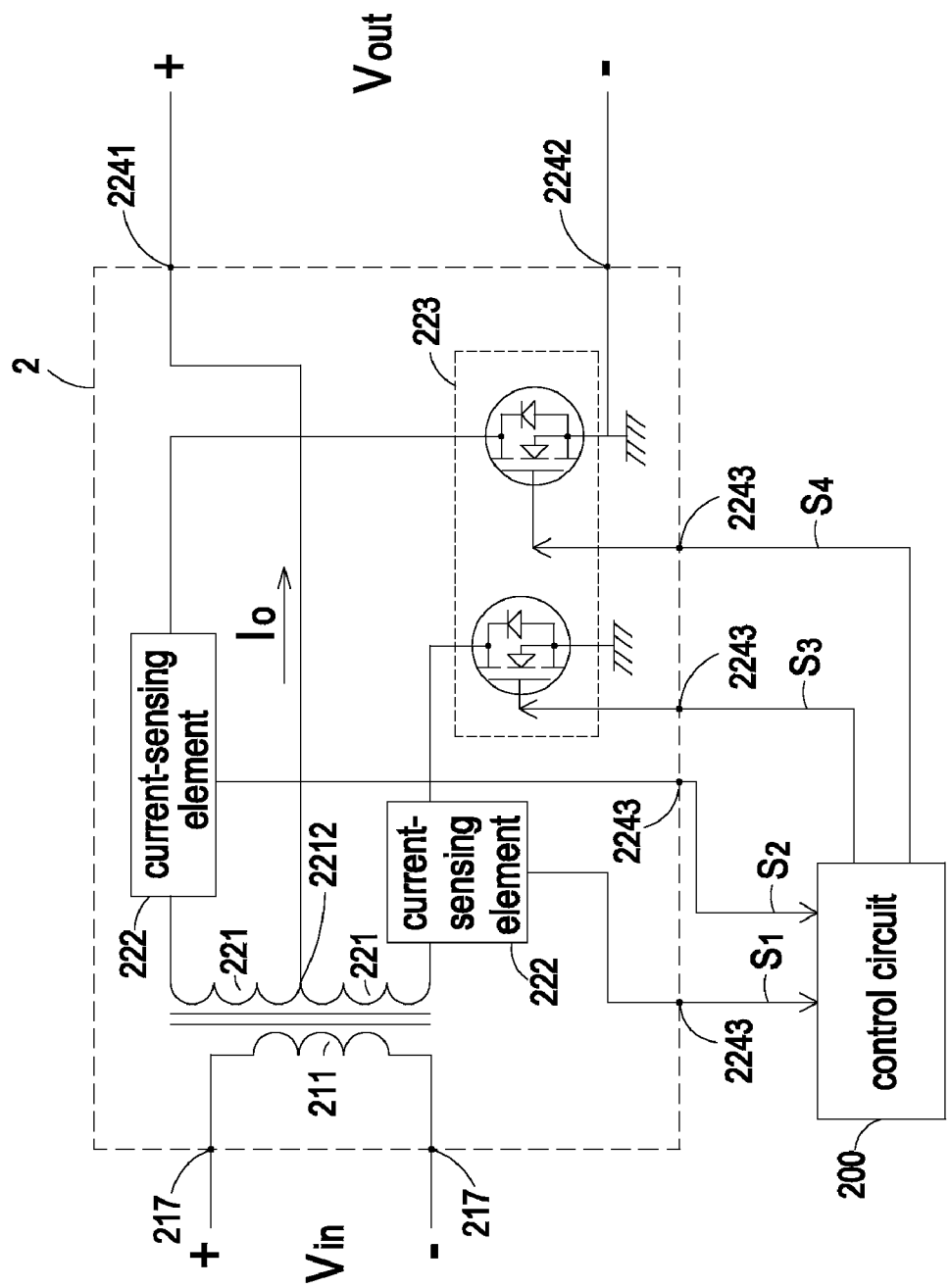
FIG. 4 is schematic circuit diagram illustrating the power module of the present invention.

FIG. 3 is a schematic assembled view illustrating the power module of FIG. 2 mounted on a system board. FIG. 4 is a schematic circuit diagram illustrating the power module of the present invention. As shown in FIGS. 3 and 4, the system board 20 comprises a control circuit 200. The power module 2 is electrically connected to the control circuit 200. The leads 217 of the first bobbin 21 of the power module 2 are inserted into corresponding insertion holes of the system board 20 such that the primary winding coil 211 is electrically connected to the system board 20 through the leads 217. The output pin 2241, the signal ground pin 2242 and the signal pins 2243 are inserted into corresponding insertion holes of the system board 20 such that the circuit board assembly 22 is electrically connected to the system board 20 through the electrical connector 224. The primary winding coil 211 of the first bobbin 21 receives an input voltage $V_{in}$ from the system board 20 through the leads 217 (see FIG. 4). In addition, an output current $I_o$ is outputted from the output terminal 2211 of the secondary winding structure 221. The first end 2221a of the first conductor 2221 of the current-sensing element 222 is in contact with the output terminal 2211 of the secondary winding structure 221, and the second end 2221b of the first conductor 2221 is connected to the rectifier circuit 223. When the output current $I_o$ passes through the first conductor 2221, the second conductor 2222 is subject to induction and thus the output current $I_o$ outputted from the secondary winding structure 221 is detected. Then, the current-sensing elements 222 issues signals $S_1$ and $S_2$ to the control circuit 200 of the system board 20 through the signal pins 2243. In response to the signals $S_1$ and $S_2$, the control circuit 200 generates control signals $S_3$ and $S_4$ to the rectifier circuits 223. In response to the control signals $S_3$ and $S_4$, the MOS switches are conducted or shut off. As such, the input voltage $V_{in}$ is rectified into a desired output voltage $V_{out}$, which is transmitted to the load (not shown) through the output pin 2241.

From the above description, since the second conductor 2222 is partially enclosed by the first conductor 2221 of the current-sensing element 222, the leakage inductance of the power module 2 is reduced. Moreover, when the secondary winding structure 221, the current-sensing element 222 and the rectifier circuits 223 are assembled into the circuit board assembly 22, the current path is shortened and the power loss of the power module is reduced.

It is noted that, however, those skilled in the art will readily observe that numerous modifications and alterations may be made while retaining the teachings of the invention. For example, in some embodiments, the first conductor of the current-sensing element is directly buried in the printed circuit board, wherein the first end and the second end of the first conductor are respectively connected to the output terminal of the secondary winding structure and the rectifier circuit. As a consequence, the current path is shortened and the leakage inductance is reduced. In some embodiments, the first output terminal of the secondary winding structure is disposed on the first surface of the printed circuit board and directly or indirectly connected to the first conductive hole. After the first conductor of the current-sensing element is inserted into the first conductive hole, the secondary winding structure is electrically connected to the first conductive hole. The numbers of the current-sensing elements, the primary winding coils and the secondary winding structures are varied according to the practical requirements. In the above embodiment, the power module is inserted into the system board. In some embodiments, the power module could be mounted on the system board according to a surface mount technology. Moreover, the control circuit could be disposed on the printed circuit board of the circuit board assembly and electrically connected to the signal pin of the electrical connector through traces.

From the above description, the current-sensing element, the secondary winding structure, the rectifier circuit and the electrical connector are mounted on the printed circuit board to form a circuit board assembly. The first bobbin, the first magnetic core assembly and the circuit board assembly are assembled into a power module. When the output current outputted from the secondary winding structure is detected by the current-sensing element, associated signals are transmitted to the control circuit. As such, the rectifier circuit is controlled by the control circuit.

As previously described, when the current-sensing element is mounted on the printed circuit board, the first end of the first conductor of the current-sensing element is in contact with the output terminal of the secondary winding structure, and the second end of the first conductor is connected to the rectifier circuit. In comparison with the prior art, the current path of the power module of the present invention is shortened. For minimizing the leakage inductance, the first conductor is a single-loop U-shaped conductive sheet enclosing the second conductor. Since the current path and the leakage inductance are reduced, the reliability and the efficiency of the power module is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module mounted on a system board, said power module comprising:
    a first bobbin;
    a primary winding coil wound around said first bobbin;
    a circuit board assembly comprising a printed circuit board, a second winding structure, at least one current-sensing element, a rectifier circuit and an electrical connector, wherein said second winding structure, said current-sensing element, said rectifier circuit and said electrical connector are mounted on said printed circuit board, said second winding structure has an output terminal, said current-sensing element comprises a first conductor, said first conductor is a conductive sheet, a first end of said first conductor is in contact with said output terminal of said second winding structure, and a second end of said first conductor is connected to said rectifier circuit; and
    a first magnetic core assembly,
    wherein said primary winding coil is aligned with said second winding structure of said circuit board assembly and arranged within said first magnetic core assembly, and said primary winding coil and said electrical connector are electrically connected with said system board.

2. The power module according to claim 1 wherein said first conductor of said current-sensing element is U-shaped.

3. The power module according to claim 1 wherein said current-sensing element further comprises:
    a second bobbin disposed on said printed circuit board;
    a second conductor disposed on said second bobbin and electrically connected to said printed circuit board, wherein said second conductor is partially enclosed by said first conductor; and
    a second magnetic core assembly, wherein said first conductor and said second conductor are arranged within said second magnetic core assembly.

4. The power module according to claim 3 wherein a first gap and a second gap exist between said second bobbin and said second magnetic core assembly, said first end of said first conductor penetrates through said first gap to be in contact with said output terminal of said second winding structure, and said second end of said first conductor penetrates through said second gap to be connected to said rectifier circuit.

5. The power module according to claim 4 wherein said printed circuit board further comprises a first conductive hole and a second conductive hole, said first conductive hole is electrically connected to said output terminal of said secondary winding structure, said first conductive hole and said second conductive hole are respectively aligned with said first gap and said second gap of said current-sensing element, and said first end and said second end of said first conductor are respectively inserted into said first conductive hole and said second conductive hole of said printed circuit board.

6. The power module according to claim 1 wherein said first conductor of said current-sensing element is a single-loop conductive sheet.

7. The power module according to claim 1 wherein said printed circuit board of said circuit board assembly further comprises a perforation running through said printed circuit board and sheathed by said second winding structure, and wherein said second winding structure is a flat conductive plate and substantially parallel with said printed circuit board.

8. The power module according to claim 7 wherein said first bobbin comprises:
    a first side plate and a second side plate, which are disposed on bilateral sides of said first bobbin;

at least one winding section arranged between said first side plate and said second side plate, wherein said primary winding coil is a conductive coil wound around said at least one winding section of said first bobbin;

a channel running through said first bobbin, wherein said perforation of said printed circuit board is aligned with said channel of said first bobbin; and a plurality of leads extended from said first side plate and said second side plate, wherein said primary winding coil is electrically connected to said system board through said leads.

9. The power module according to claim 8 wherein said first magnetic core assembly comprises a first magnetic part and a second magnetic part, each of said first magnetic part and said second magnetic part includes a flat slab, two leg portions and a middle post, said two leg portions are vertically protruded from bilateral edges of said flat slab, said middle post is arranged between said two leg portions, said middle post is embedded into said channel of said first bobbin and said perforation of said printed circuit board, and said first bobbin and said printed circuit board are partially enclosed by said flat slab and said leg portions.

10. The power module according to claim 8 wherein said first bobbin further comprises a plurality of partition plates arranged between said first side plate and said second side plate, and a receiving part is defined by said partition plates for accommodating said second winding structure and a portion of said printed circuit board.

11. The power module according to claim 1 wherein said electrical connector comprises an output pin, a signal ground pin and a signal pin, which are extended from said printed circuit board and mounted on said system board.

12. The power module according to claim 1 wherein said power module is connected to a control circuit, wherein when an output voltage outputted from said second winding structure is detected by said current-sensing element, said current-sensing element generates a signal to said control circuit such that said rectifier circuit is controlled by said control circuit.

13. A circuit board assembly of a power module, said power module being mounted on a system board, said power module comprising a first bobbin and a first magnetic core assembly, a primary winding coil being wound around said first bobbin, said circuit board assembly comprising:

a printed circuit board;

a second winding structure disposed on said printed circuit board and comprising an output terminal, wherein said second winding structure is aligned with said primary winding coil, and arranged within said first magnetic core assembly;

at least one current-sensing element disposed on said printed circuit board and comprising a first conductor, wherein said first conductor is a conductive sheet and has a first end and a second end;

a rectifier circuit; and an electrical connector, wherein a first end of said first conductor is in contact with said output terminal of said second winding structure, a second end of said first conductor is connected to said rectifier circuit, and said circuit board assembly is electrically connected to said system board through said electrical connector.

14. The circuit board assembly according to claim 13 wherein said first conductor of said current-sensing element is U-shaped.

15. The circuit board assembly according to claim 13 wherein said current-sensing element further comprises:

a second bobbin disposed on said printed circuit board;

a second conductor disposed on said second bobbin and electrically connected to said printed circuit board, wherein said second conductor is partially enclosed by said first conductor; and a second magnetic core assembly, wherein said first conductor and said second conductor are arranged within said second magnetic core assembly.

16. The circuit board assembly according to claim 15 wherein a first gap and a second gap exist between said second bobbin and said second magnetic core assembly, said first end of said first conductor penetrates through said first gap to be in contact with said output terminal of said second winding structure, and said second end of said first conductor penetrates through said second gap to be connected to said rectifier circuit.

17. The circuit board assembly according to claim 16 wherein said printed circuit board further comprises a first conductive hole and a second conductive hole, said first conductive hole is electrically connected to said output terminal of said secondary winding structure, said first conductive hole and said second conductive hole are respectively aligned with said first gap and said second gap of said current-sensing element, and said first end and said second end of said first conductor are respectively inserted into said first conductive hole and said second conductive hole of said printed circuit board.

18. The circuit board assembly according to claim 13 wherein said first conductor of said current-sensing element is a single-loop conductive sheet.

19. The circuit board assembly according to claim 13 wherein said printed circuit board of said circuit board assembly further comprises a perforation running through said printed circuit board and sheathed by said second winding structure, and wherein said second winding structure is a flat conductive plate and substantially parallel with said printed circuit board.

20. The circuit board assembly according to claim 13 wherein said electrical connector comprises an output pin, a signal ground pin and a signal pin, which are extended from said printed circuit board and mounted on said system board.

* * * * *